United States Patent
Chang

[19]

[11] Patent Number: 5,808,176
[45] Date of Patent: Sep. 15, 1998

[54] SOLVING PRODUCTION DOWNTIME WITH PARALLEL LOW PRESSURE SENSORS

[75] Inventor: Shen-Yan Chang, Chu-Pei, Taiwan

[73] Assignee: Vanguard International Semiconductor Corporation, Hsin-Chu, Taiwan

[21] Appl. No.: 970,534

[22] Filed: Nov. 14, 1997

Related U.S. Application Data

[62] Division of Ser. No. 868,471, Jun. 3, 1997.

[51] Int. Cl.[6] .................................................. G01L 27/00
[52] U.S. Cl. ......................................................... 73/1.58
[58] Field of Search ............................. 137/15, 594, 625, 137/625.11, 625.18, 557, 605, 606, 597, 628; 73/714, 756, 1.58

[56] References Cited

U.S. PATENT DOCUMENTS 5,348,614  9/1994  Jerbic ...................................... 156/626
5,443,997  8/1995  Tsui et al. ............................... 437/225

FOREIGN PATENT DOCUMENTS 1275243  12/1986  U.S.S.R. .................................. 73/4 V
1441212  11/1988  U.S.S.R. .................................. 73/4 V

*Primary Examiner*—Robert Raevis
*Attorney, Agent, or Firm*—George O. Saile; Stephen B. Ackerman

[57] ABSTRACT

An in-process method and apparatus for monitoring and correcting or replacing a low pressure sensor that gives incorrect low pressure readings because of being contaminated or defective during the formation of integrated circuit structures in a low pressure chemical vapor deposition chamber, where deposition rates are a function of gas flow, temperature, and chamber pressure.

4 Claims, 2 Drawing Sheets

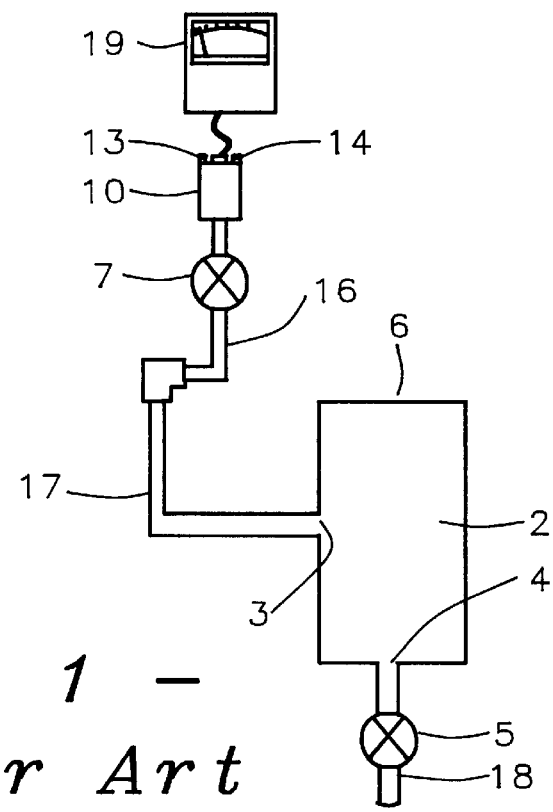
FIG. 1 - Prior Art
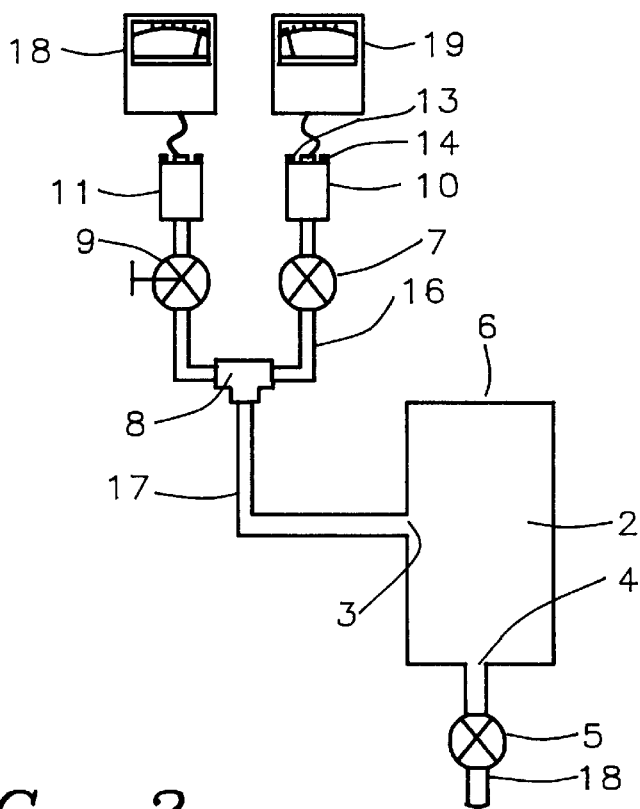
FIG. 2

SOLVING PRODUCTION DOWNTIME WITH PARALLEL LOW PRESSURE SENSORS

This is a division of Patent application Ser. No. 08/868,471, filing date Jun. 3, 1997, Solving Production Downtime With Parallel Low Pressure Sensors, assigned to the same assignee as the present invention.

BACKGROUND OF THE INVENTION (1) Technical Field

This invention pertains to a thin film deposition process for forming integrated circuit structures, and more specifically relates to a novel method for reducing production down time caused by condensation effects on the pressure sensor that measures Low Pressure in the Chemical Vapor Deposition chamber (2) Description of the Prior Art The following two documents relate to various methods dealing with sensing of process parameters during deposition of thin film in a low pressure environment.

U.S. Pat. No. 5,443,997 issued Aug. 22, 1995 to Chiu-Wing Tsui et al, discloses a method of controlling the flow and monitoring the pressure of gases.

U.S. Pat. No. 5,348,614 issued Sep. 20, 1994 to Chris Jerbic discloses a process for adjusting the concentration and monitoring the flow of reactant gases.

During the deposition processing of substrates such as semiconductor wafers to form integrated circuit structures thereon, the condensation in the vacuum chamber eventually builds up and contaminates the pressure sensor (gauge) effecting a zero point shift, hence, indicating a misleading chamber pressure. The zero point is the pressure at which the instrument displays zero pressure. Because deposition rates are a function of gas flow, reactor temperature, and total pressure, it is imperative that these parameters be controlled precisely.

An experienced operator is needed to empirically determine when the zero point shift is about to occur since no other references are at hand. If for example, an operator determines, empirically, that it is time to adjust the pressure sensor since a zero point shift is imminent, the deposition station is shut down, the pressure sensor is removed and replaced and a test run is done with the new sensor in place. Between 4 to 5 hours are lost each time a defective sensor is replaced. The useful lifetime of a sensor in this environment is only 1 month.

It would, therefore, be desirable to be able to provide a method and apparatus for the formation of integrated circuit structures wherein the effects of condensation build up on the pressure sensor during oxide etch or any of the chemical vapor deposition processes can be monitored and compared to a process pressure standard and adjusted accordingly without production interference or lost time.

SUMMARY OF THE INVENTION

The present invention provides an improved method for measuring and correcting pressure reading errors caused by condensation build-up in the pressure sensor circuit.

It is a primary object of the present invention to provide apparatus to compare the deposition pressure against an accessable reference sensor reading and to correct the deposition pressure by adjusting the zero point shift and linearity means to match the reference pressure without needing to shut down the system.

It is a another object of the present invention to provide a process for the removal and replacement of a defective pressure sensor without needing to shut down production for a test run.

These objects are achieved by installing a second in-line valve (manually operated), a second sensor and a second pressure indicator that are all mounted in series and then mounted parallel to the first set of pressure sensing components. When a zero shift or slope change requires adjustment, the manual in-line valve is opened to conduct the chamber pressure to the second (reference) sensor. Adjustment is made to the first sensor's adjustment means until its displayed pressure coincides with the displayed reference pressure. The manual valve is then turned off thus shielding the reference sensor from the process contaminants.

The foregoing and other objects, features and advantages of the invention will be apparent from the following more particular description of the preferred embodiment of the invention as illustrated in the drawings.

BRIEF DESCRIPTION OF THE DRAWINGS

FIG. 1 illustrates in a symbolic schematic drawing the prior art apparatus that is used for measuring pressure in a low pressure deposition chamber.

FIG. 2 illustrates the present invention improvements to a conventional low pressure deposition chamber.

DETAILED DESCRIPTION OF THE PREFERRED EMBODIMENT

Figure 3:
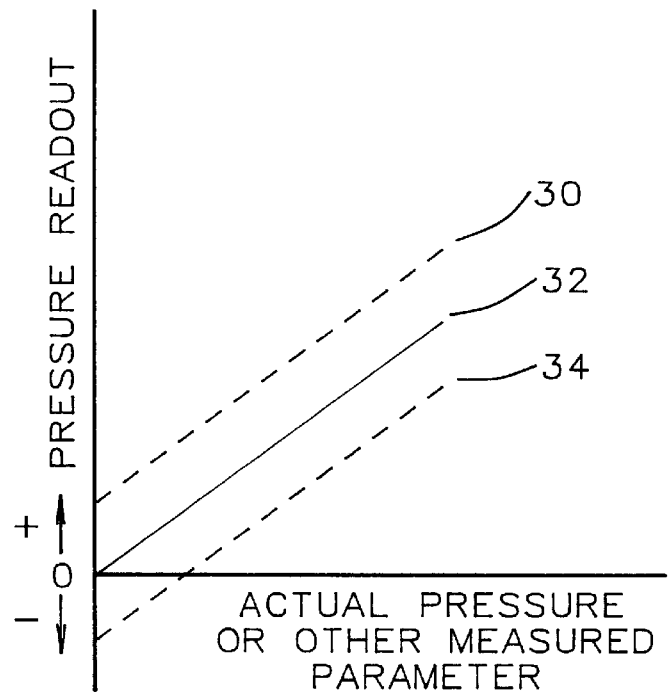
FIG. 3 is a calibration curve depiction of the "zero point shift".

An aspect of the present invention is concerned with improvements to the methods and apparatus used for adjusting and calibrating low pressure sensors in semiconductor processes.

Referring to the drawings and especially FIG. 1 thereof, a conventional low pressure deposition or chamber 2 is generally indicated to best demonstrate the restraints and difficulties when adjusting the readout for the zero shifted sensor. Chamber 2 comprises enclosure wall 6, an evacuation port 4 which is connected through in-line valve 5 and pipe 18 to an external pumping source (not shown) to maintain the desired pressure in chamber 2. Pressure is conducted to sensor 10 through port 3 which is connected by pipes 16, 17 and on through in-line valve 7.

When a zero point shift is imminent electrical power to chamber 2 is shut off closing in-line valves 5 and 7 (urged to closed position without power). Chamber 2 is exhausted to atmosphere permitting sensor 10 to be removed for recalibration and replaced with a new or a recalibrated sensor. Power is restored and a test run is performed to adjust the pressure level of vessel 2. This operation requires 4 to 5 hours of lost production time to complete.

In accordance with the invention, the method to adjust for zero point shift and linearity, or, for the removal and replacement of a defective pressure sensor without loss of production time includes the steps of adding bifurcated union 8, manually operated valve 9, reference sensor 11 and a digital readout 18 as best illustrated in FIG. 2. If a zero shift is suspected, opening manual valve 9 permits conduction of chamber's 2 pressure to be displayed on the reference readout 18 and compared against the pressure displayed on the process readout 19. If there is no apparent zero shift then manual valve 9 is manually closed, if a shift is detected then manual valve 9 is kept open for the adjustment procedure. Referring to and best explained in FIGS. 2, 3 and 4, zeroing suggests adjusting the readout 19 for sensor 10. Turning adjustment screw 13, on sensor 10, clockwise lowers a positive shift while turning it counter clockwise raises a negative shift. The zero point is the pressure at which the instrument displays zero pressure. For low pressure sensors of the type conventionally used in deposition chambers, zero point is the output voltage at which zero pressure is referenced. Zero adjustment is an additive/subtractive process which moves a sensors's range up or down on the pressure axis. Gradients 30 and 34 (FIG. 3) graphically represent a positive and negative zero shifted pressure whose magnitude is displayed on pressure indicator 19 and corrected by either lowering or raising its zeros respectively to correspond to its reference pressure as displayed on pressure indicator 18 also shown by gradient 32.

Figure 4:
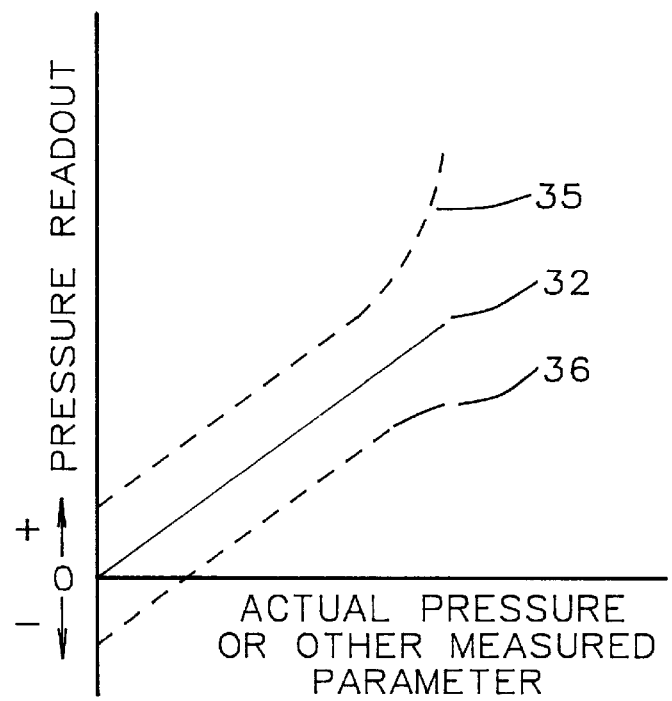
FIG. 4 is a calibration curve depiction of both "zero point and slope shift".

FIG. 4 illustrates a sensor's slope change along with a zero point shift. The zero shift is corrected as previously described. The slope correction adjusts the upper range of sensor 10 which may have drifted due to contamination or aging. After the deposition cycle has been completed and chamber 2 is exhausted to 760 torr(atmospheric pressure) the sloped curves 35 and 36, as illustrated in FIG. 4, are corrected by turning slope adjustment screw 14 on in-line valve 10 until its pressure reading displayed on pressure indicator 19 matches the reference pressure displayed on pressure indicator 18.

Condensation will eventually damage the sensor. This becomes evident when shifts and slopes can no longer be adjusted to zero reference. To this end, sensor 10 must be replaced. In order to effect a continuous process, manual valve 9 is opened while valve 7 is closed, sensor 11 will temporarily serve as the in-process monitor until sensor 10 is replaced. After replacing sensor 10, in-line valve 7 is opened and manual valve 9 is closed since there is no need to run the lengthy test procedure for the pressure adjustment in vessel 2 since the new sensor's zero is the same as the reference sensor's zero.

While the invention has been particularly shown and described with reference to the preferred embodiments thereof, it will be understood by those skilled in the art that various changes in form and details may be made without departing from the spirit and scope of the invention.

What is claimed is:

1. Apparatus for adjusting and replacing a defective sensor used in a low pressure semiconductor processing chamber comprising:

a) a bifurcated union communicating pressure from the chamber's pressure port to the first path of said bifurcated union and on to a first in-line valve connecting the defective sensor and first pressure indicator and through the second path of said bifurcated union to;

b) a second in-line valve which is connected in series to;

c) a second low pressure sensor and;

d) a second pressure indicator.

2. The apparatus of claim 1 wherein said second in-line valve is a manually operated bellows sealed valve with its inlet port connected to a bifurcated junction.

3. The apparatus of claim 1 wherein said second low pressure sensor is a capacitance manometer with its inlet connected to the outlet port of the second in-line valve.

4. The apparatus of claim 1 wherein said second pressure indicator is a dual-channel digital pressure indicator with input signals transmitted from said first and second low pressure sensors.

* * * * *